United States Patent
Amano et al.

(10) Patent No.: US 9,412,586 B2
(45) Date of Patent: *Aug. 9, 2016

(54) METHOD FOR PRODUCING A TEMPLATE FOR EPITAXIAL GROWTH HAVING A SAPPHIRE (0001) SUBSTRATE, AN INITIAL-STAGE A1N LAYER AND LATERALLY OVERGROWN A1XGAYN (0001) LAYER

(75) Inventors: Hiroshi Amano, Aichi (JP); Satoshi Kamiyama, Aichi (JP); Myunghee Kim, Aichi (JP); Cyril Pernot, Aichi (JP); Akira Hirano, Aichi (JP)

(73) Assignee: SOKO KAGAKU CO., LTD., Aichi (JP)

( * ) Notice: Subject to any disclaimer, the term of this patent is extended or adjusted under 35 U.S.C. 154(b) by 833 days.

This patent is subject to a terminal disclaimer.

(21) Appl. No.: 13/517,970

(22) PCT Filed: Dec. 25, 2009

(86) PCT No.: PCT/JP2009/071541
§ 371 (c)(1),
(2), (4) Date: Jun. 20, 2012

(87) PCT Pub. No.: WO2011/077541
PCT Pub. Date: Jun. 30, 2011

(65) Prior Publication Data
US 2012/0258286 A1  Oct. 11, 2012

(51) Int. Cl.
*C30B 25/18* (2006.01)
*H01L 21/02* (2006.01)
(Continued)

(52) U.S. Cl.
CPC .......... *H01L 21/0242* (2013.01); *C30B 25/186* (2013.01); *C30B 29/403* (2013.01);
(Continued)

(58) Field of Classification Search
CPC ........ C30B 25/00; C30B 25/02; C30B 25/04; C30B 25/18; C30B 25/183; C30B 25/186; C30B 29/00; C30B 29/10; C30B 29/40; C30B 29/403; C30B 29/406; H01L 21/0243; H01L 21/02433; H01L 21/02455; H01L 21/02458; H01L 21/02538; H01L 21/0254; H01L 21/0262; H01L 21/02639; H01L 21/02647; H01L 21/0265
USPC ............... 117/84, 88–90, 92, 94–95, 97, 101, 117/103, 104–106, 108, 902, 937, 952
See application file for complete search history.

(56) References Cited

U.S. PATENT DOCUMENTS

| | | | |
|---|---|---|---|
| 6,426,519 B1 * | 7/2002 | Asai | C30B 25/02 257/103 |
| 8,659,031 B2 * | 2/2014 | Kim | C30B 25/183 257/76 |

(Continued)

FOREIGN PATENT DOCUMENTS

| | | |
|---|---|---|
| EP | 1265272 A1 | 12/2002 |
| JP | 2003218395 A | 7/2003 |

(Continued)

OTHER PUBLICATIONS

S. Mita, et al. publication entitled "Polarity control of GaN films grown by metal organic chemical vapor deposition on (0001) sapphire substrates," Mater. Res. Soc. Symp. Proc., vol. 10, pp. E3.20.1-E3.20.6 (2005).*

(Continued)

*Primary Examiner* — Kenneth A Bratland, Jr.
(74) *Attorney, Agent, or Firm* — Haynes Beffel & Wolfeld LLP

(57) ABSTRACT

A surface of a sapphire (0001) substrate is processed to form recesses and protrusions so that protrusion tops are flat and a given plane-view pattern is provided. An initial-stage AlN layer is grown on the surface of the sapphire (0001) substrate having recesses and protrusions by performing a C+ orientation control so that a C+ oriented AlN layer is grown on flat surfaces of the protrusion tops, excluding edges, in such a thickness that the recesses are not completely filled and the openings of the recesses are not closed. An $Al_xGa_yN(0001)$ layer ($1 \geq x > 0$, $x+y=1$) is epitaxially grown on the initial-stage AlN layer by a lateral overgrowth method. The recesses are covered with the $Al_xGa_yN(0001)$ layer laterally overgrown from above the protrusion tops. Thus, an template for epitaxial growth having a fine and flat surface and a reduced threading dislocation density is produced.

8 Claims, 13 Drawing Sheets

(51) Int. Cl.
 C30B 29/40 (2006.01)
 H01L 33/00 (2010.01)
(52) U.S. Cl.
 CPC ........ *H01L21/0243* (2013.01); *H01L 21/0254* (2013.01); *H01L 21/0262* (2013.01); *H01L 21/0265* (2013.01); *H01L 21/02458* (2013.01); *H01L 21/02639* (2013.01); *H01L 33/007* (2013.01); *Y10T 428/24529* (2015.01)

(56) References Cited

U.S. PATENT DOCUMENTS

| | | | |
|---|---|---|---|
| 2002/0090816 | A1 | 7/2002 | Ashby et al. |
| 2002/0110997 | A1* | 8/2002 | Linthicum ......... H01L 21/0237 438/479 |
| 2003/0168666 | A1 | 9/2003 | Okuyama et al. |
| 2009/0057646 | A1 | 3/2009 | Hirayama et al. |
| 2011/0108104 | A1 | 5/2011 | Kim et al. |

FOREIGN PATENT DOCUMENTS

| | | |
|---|---|---|
| JP | 3455512 B2 | 10/2003 |
| JP | 2006253462 A | 9/2006 |
| WO | 2009090821 A1 | 7/2009 |

OTHER PUBLICATIONS

S. Mita, et al. publication entitled "Polarity control of GaN films grown by metal organic chemical vapor deposition on (0001) sapphire substrtes," Mat. Res. Soc. Symp. Proc., vol. 10, pp. E3.20.1-E3.20.6 (2005).*
K. Nagamatsu, et al. publication entitled "High-efficiency AlGaN-based UV light-emitting diode on laterally overgrown AlN," Journal of Crystal Growth, vol. 310, pp. 2326-2329 (2008).*
M. Takeuchi, et al. publication entitled "Al- and N-polar AlN layers grown on c-plane sapphire substrates by modified flow-modulation MOCVD," Journal of Crystal Growth, vol. 305, pp. 360-365 (2007).*
Nagamatsu, Kentaro et al.; "High-efficiency AlGaN-based UV light-emitting diode on laterally overgrown AlN; Journal of Crystal Growth"; 310; pp. 2326-2329; 2008.
Nakano, K. et al.; "Epitaxial lateral overgrowth of AlN layers on patterned sapphire substrates"; phys. stat. sol. (a) 203, No. 7; pp. 1632-1635; 2006.
Mei, J. et al.; "Dislocation generation at the coalescence of aluminum nitride lateral epitaxy on shallow-grooved sapphire substrates"; Applied Physics Letters 90, 221909; 2007.
Mita, et al., "Polarity control of GaN films grown by metal organic chemical vapor deposition on (0001) sapphire substrates." In MRS Proceedings, vol. 831,Cambridge University Press, from 2004 MRS Fall Meeting, Nov. 28-Dec. 2, 2004, pp. E3.20.1-E3.20.6.
Rajan et al., "Growth and Electrical Characterization of N-face AlGaN/GaN Heterostructures," Japanese Journal of Applied Physics, vol. 44, No. 49, Nov. 25, 2005, pp. L1478-L1480.
Hirayama, et al., "Fabrication of a low threading dislocation density ELO-AlN template for application to deep-UV LEDs", Phys. Stat. Sol. C 6, No. S2, Mar. 2009, pp. S356-S359.
Kumagai, et al., "Polarity dependence of AlN {0001}decomposition in flowing H2", Journal of Crystal Growth, 305(2), Jul. 15, 2007, pp. 366-371.

* cited by examiner

US 9,412,586 B2

METHOD FOR PRODUCING A TEMPLATE FOR EPITAXIAL GROWTH HAVING A SAPPHIRE (0001) SUBSTRATE, AN INITIAL-STAGE AlN LAYER AND LATERALLY OVERGROWN AlXGAYN (0001) LAYER

CROSS-REFERENCE TO RELATED APPLICATIONS

This application is a National Phase filing under 35 U.S.C. §371 of International Application No. PCT/JP2009/071541 filed on Dec. 25, 2009.

TECHNICAL FIELD

The present invention relates to a template for epitaxial growth as an underlying substrate where a GaN compound semiconductor layer (general formula: $Al_xGa_yIn_{1-x-y}N$) is epitaxially grown, and also relates to a method for producing the same.

BACKGROUND ART

GaN nitride semiconductor devices such as light-emitting diodes and semiconductor lasers are conventionally produced by growing a multi-layered GaN compound semiconductor layer on a template for epitaxial growth (for example, see Non-patent Document 1). FIG. 13 illustrates a typical crystal layer structure of a conventional GaN light-emitting diode. The light-emitting diode shown in FIG. 13 has a laminated structure. In the structure, after an underlying layer 102 of AlN is formed on a sapphire substrate 101 and then a cyclic groove pattern is formed thereon by photolithography and reactive ion etching, an ELO-AlN layer 103 is formed; plus an n-type clad layer 104 of n-type AlGaN having a thickness of 2 μm, an AlGaN/GaN multi-quantum well active layer 105, a p-type AlGaN electron block layer 106 having a higher Al composition ratio than the multi-quantum well active layer 105 and having a thickness of 20 nm, a p-type clad layer 107 of p-type AlGaN having a thickness of 50 nm, and a p-type GaN contact layer 108 having a thickness of 20 nm are sequentially stacked on the ELO-AlN layer 103. The multi-quantum well active layer 105 has a multi-layered structure including five stacking layers including a GaN well layer of 2 nm in thickness that is sandwiched with AlGaN barrier layers of 8 nm in thickness. After crystal growth, in order to expose a portion of the surface of the n-type clad layer 104, the multi-quantum well active layer 105, the electron block layer 106, the p-type clad layer 107, and the contact layer 108 thereon are etched off. A p-electrode 109 of Ni/Au is formed on the surface of the contact layer 108, for example, and an n-electrode 110 of Ti/Al/Ti/Au is formed on the surface of the exposed n-type clad layer 104, for example. By making a GaN well layer into an AlGaN well layer and changing the Al composition ratio or the thickness of the AlGaN well layer, the emission wavelength is shortened, or by adding In to the layer, the emission wavelength is lengthened, thus providing a light-emitting diode in an ultraviolet region having a wavelength of about 200 nm to 400 nm. Semiconductor lasers may be produced similarly. In the crystal layer structure shown in FIG. 13, a template for epitaxial growth is formed of the sapphire substrate 101, the AN underlying layer 102, and the ELO-AlN layer 103.

The crystal quality of the template surface directly affects the crystal quality of the GaN compound semiconductor layer formed thereon, providing significant effects on the characteristics of a light-emitting device or the like which is formed as a result. In providing a light-emitting diode or a semiconductor laser in the ultraviolet region, it is particularly desirable to use a template having a reduced threading dislocation density of $10^7/cm^2$ or less or preferably about $10^6/cm^2$. When the ELO-AlN layer 103 is epitaxially grown by an epitaxial lateral overgrowth (ELO) method on the AlN underlying layer 102 having a cyclic groove pattern as shown in FIG. 13, the AlN layer grown from the flat surfaces of the protrusions between the grooves overgrows laterally so as to cover over the tops of the grooves, and at the same time, the threading dislocation grown from the flat surfaces concentrates above the grooves due to the lateral overgrowth, so that the threading dislocation density is reduced significantly.

However, for the template including the sapphire substrate, the AlN underlying layer, and the ELO-AlN layer as shown in FIG. 13, it is necessary to remove a sample (substrate) once from a reaction chamber for an epitaxial growth after the AlN underlying layer is grown, and to form a cyclic groove pattern on the surface of the AlN underlying layer by photolithography and reactive ion etching. Thus, the AlN underlying layer and the ELO-AlN layer cannot be grown continuously, and the manufacturing process becomes complex and the throughput decreases, thereby increasing manufacturing costs.

On the other hand, in order to prevent the complication of the manufacturing process and the decrease in throughput by omitting etching between crystal growth processes, proposed are the methods of providing a template for epitaxial growth in which a cyclic groove pattern is directly formed on the surface of the sapphire substrate by photolithography and reactive ion etching or the like, and the ELO-AlN layer is formed directly on the sapphire substrate (for example, see Patent Document 1, and Non-patent Documents 2 and 3). In order to grow an ELO-AlN layer on the grooved surface of a substrate, it is preferable to form deeper grooves on the sapphire substrate surface since the AlN layer grown from the bottom of the grooves needs to be separate from the AlN layer laterally overgrown from the flat surfaces of the protrusions between the grooves. However, the sapphire substrate has a low etching rate and is difficult to process, so that an ELO-AlN layer having a low threading dislocation density needs to be grown on a shallow-grooved substrate.

PRIOR ART DOCUMENTS

Patent Document

Patent Document 1: Japanese Patent No. 3455512

Non-Patent Document

Non-patent Document 1: Kentaro Nagamatsu, et al., "High-efficiency AlGaN-based UV light-emitting diode on laterally overgrown AlN", Journal of Crystal Growth, 310, pp. 2326-2329, 2008

Non-patent Document 2: N. Nagano, et al., "Epitaxial lateral overgrowth of AlN layers on patterned sapphire substrates", phys. stat. sol. (a) 203, No. 7, pp. 1632-1635, 2006

Non-patent Document 3: J. Mei, et al., "Dislocation generation at the coalescence of aluminum nitride lateral epitaxy on shallow-grooved sapphire substrates", Applied Physics Letters 90, 221909, 2007

SUMMARY OF THE INVENTION

Problems to be Solved by the Invention

According to Non-patent Document 2, when the ELO-AlN layer is directly grown on the sapphire (0001) substrate surface having grooves in the (10-10) direction, the layer grows laterally and then covers over the grooves at 1,100° C., the general growth temperature of epitaxially overgrowing AlN on the sapphire (0001) substrate, but the grown ELO-AlN has an extremely rough surface. However, at 1,300° C., the surface of the grown ELO-AlN is flat at the atomic level. That is, when the ELO-AlN layer is directly grown on the grooved surface of the sapphire (0001) substrate, the layer needs to be grown under high temperature of 1,300° C. or above. Although Patent Document 1 mentioned above does not disclose a specific AlN growth temperature, the growth temperature is thought to be 1,350° C. or above, or 1,400° C. or above as the layer is grown at an extremely high growth speed (at 1 µm per minute).

As described above, a high temperature treatment of 1,300° C. or above is conventionally required so as to provide a fine and flat ELO-AlN layer surface when an ELO-AlN layer is directly grown on the surface of a sapphire (0001) substrate. However, a heater, used for the heating, wears out much faster at the growth temperature of 1,300° C. or above than at below 1,300° C., and it is also difficult to produce the products in a stable yield. Thus, it is preferable to grow an ELO-AlN layer on the grooved surface of a sapphire (0001) substrate with stability at the growth temperature below 1,300° C.

The present invention has been made in consideration of these problems, and an object thereof is to provide a method for producing a template for epitaxial growth in which an AlN layer or an AlGaN layer having a fine and flat surface is epitaxially grown on a sapphire (0001) substrate surface formed with recesses and protrusions such as grooves by a lateral overgrowth method, even at the growth temperature below 1,300° C., and to provide a template for epitaxial growth that has a reduced threading dislocation density.

Means for Solving the Problem

The present inventors discovered that an epitaxially grown AlN layer or AlGaN layer having a fine and flat surface is provided by a lateral overgrowth method even at a growth temperature below 1,300° C., by first epitaxially growing an initial-stage AlN layer that is oriented in the c+ axis direction, in other words, that is subjected to C axis orientation control (polarity control) so as to make Al atoms appear at the outermost surface of growth crystals in a wurtzite crystal structure, on the flat surface of protrusion tops of a sapphire (0001) substrate formed with recesses and protrusions as grooves, and then expitaxially growing an AlN layer or an AlGaN layer so as to cover over the recesses by a lateral overgrowth method; and that a template for epitaxial growth having a reduced threading dislocation density is provided accordingly. Group III nitride crystals having a wurtzite crystal structure generally grow in the polarity of either group III atoms or nitrogen atoms in respect to the C axis direction, depending on the type of substrates and the conditions of the initial growth stage. When AlN is grown on the surface of a sapphire (0001) substrate, the polarity of Al needs to be actively controlled. Otherwise, an N polar face often appears on the outermost surface of growth crystals.

In other words, in order to achieve the above object, the present invention provides a method for producing a template for epitaxial growth that includes: processing a surface of a sapphire (0001) substrate to form recesses and protrusions on the surface so that protrusion tops are made flat with a given plan-view pattern;

epitaxially growing an initial-stage AlN layer on the surface of the sapphire (0001) substrate having the recesses and protrusions by performing C axis orientation control so that a C+ axis oriented AlN layer grows on flat surfaces of the protrusion tops, excluding edges, and that the AlN layer deposited on the recesses obtained by the recesses and protrusions forming process forms new recesses over the existing recesses; and epitaxially growing an $Al_xGa_yN(0001)$ layer ($1 \geq x > 0$, $x+y=1$) on the initial-stage AlN layer by a lateral overgrowth method so as to cover the new recesses with the $Al_xGa_yN(0001)$ layer laterally overgrown from above the protrusion tops.

Moreover, according to a second characteristic of the method for producing a template for epitaxial growth, having the above characteristic, the recesses are formed on the sapphire (0001) substrate surface at a depth of 1.0 µm or less.

Furthermore, according to a third characteristic of the method for producing a template for epitaxial growth, having the above characteristic, an AlN layer that is not oriented in the C+ axis is grown near steps formed by recesses and protrusions during growth of the initial-stage AlN layer.

According to a fourth characteristic of the method for producing a template for epitaxial growth, having the above characteristic, the $Al_xGa_yN(0001)$ layer is an AlN(0001) layer.

Additionally, in order to achieve the above object, the present invention provides a template for epitaxial growth including a sapphire (0001) substrate processed to form recesses and protrusions on its surface so that protrusion tops are made flat with a given plan-view pattern; an initial-stage AlN layer epitaxially grown on the surface of the sapphire (0001) substrate having the recesses and protrusions; and an $Al_xGa_yN(0001)$ layer ($1 \geq x > 0$, $x+y=1$) epitaxially grown on the initial-stage AlN layer by a lateral overgrowth method, wherein the initial-stage AlN layer is provided so that a C+ axis oriented AlN layer grows on flat surfaces of the protrusion tops, excluding the edges, and that the AlN layer deposited on the recesses obtained by the recesses and protrusions forming process forms new recesses over the existing recesses, and the new recesses are covered with the $Al_xGa_yN(0001)$ layer that is laterally overgrown from above the protrusion tops.

Additionally, according to a second characteristic of the template for epitaxial growth, having the above characteristic, the recesses are formed on the sapphire (0001) substrate surface at a depth of 1.0 µm or less.

Furthermore, according to a third characteristic of the template for epitaxial growth, having the above characteristic, the initial-stage AlN layer includes an AlN layer that is not oriented in the C+ axis near steps formed by the recesses and protrusions.

Moreover, according to a fourth characteristic of the template for epitaxial growth, having the above characteristic, the $Al_xGa_yN(0001)$ layer is an AlN(0001) layer.

Effect of the Invention

According to the method for producing a template for epitaxial growth or the template for epitaxial growth, an AlN layer or an AlGaN layer having a fine and flat surface and a reduced threading dislocation density is epitaxially grown on a sapphire (0001) substrate having recesses and protrusions on its surface by a lateral overgrowth method at a growth temperature below 1,300° C., lower than conventional growth temperature. Specifically, the initial-stage AlN layer, an underlying layer for epitaxially growing an AlN layer or an AlGaN layer thereon by a lateral overgrowth method, has portions that are epitaxially grown from the flat surface of the protrusion tops, and are oriented in the C+ axis. Specifically, the surface of the initial-stage AlN layer is an Al polar face uniformly. Thus, even at a growth temperature below 1,300° C., the AlN layer or AlGaN layer grown epitaxially from thereabove by a lateral overgrowth method has a fine and flat surface and has a reduced threading dislocation density. As a result, a GaN nitride semiconductor layer of high crystal quality is stably provided as a layer formed thereon without increasing manufacturing costs, and thus a semiconductor device having the GaN nitride semiconductor layer will have superior properties.

MODE FOR CARRYING OUT THE INVENTION

The following describes embodiments of a method for producing a template for epitaxial growth (hereinafter, sometimes referred to as the "present production process") and a template for epitaxial growth (hereinafter, sometimes referred to as the "present template") according to the present invention with reference to the drawings.

Figure 1A:
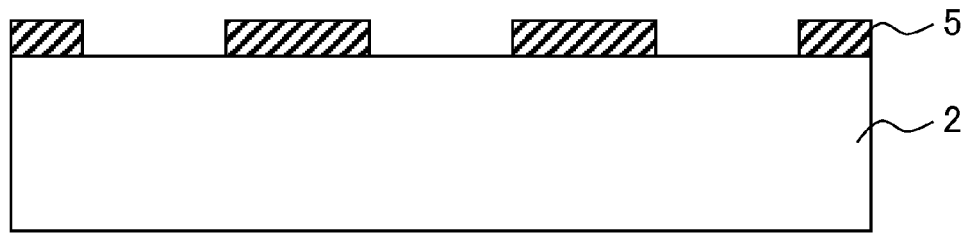
FIGS. 1A to 1D are cross-sectional flow diagrams, each schematically illustrating a flow of a method for producing a template for epitaxial growth according to the present invention.
Figure 1B:
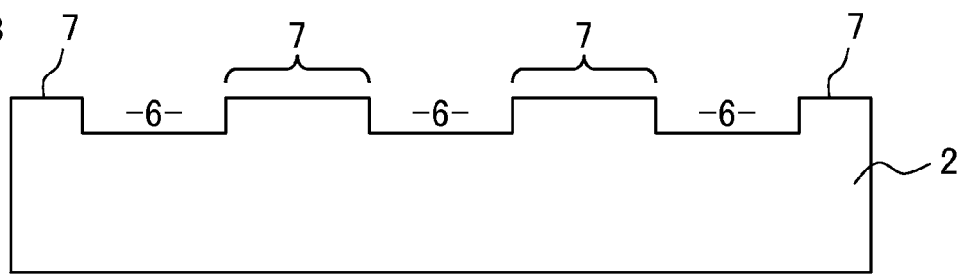
Figure 1C:
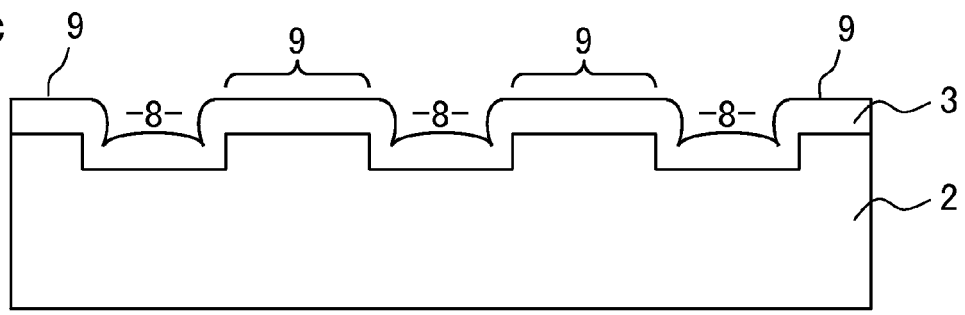
Figure 1D:
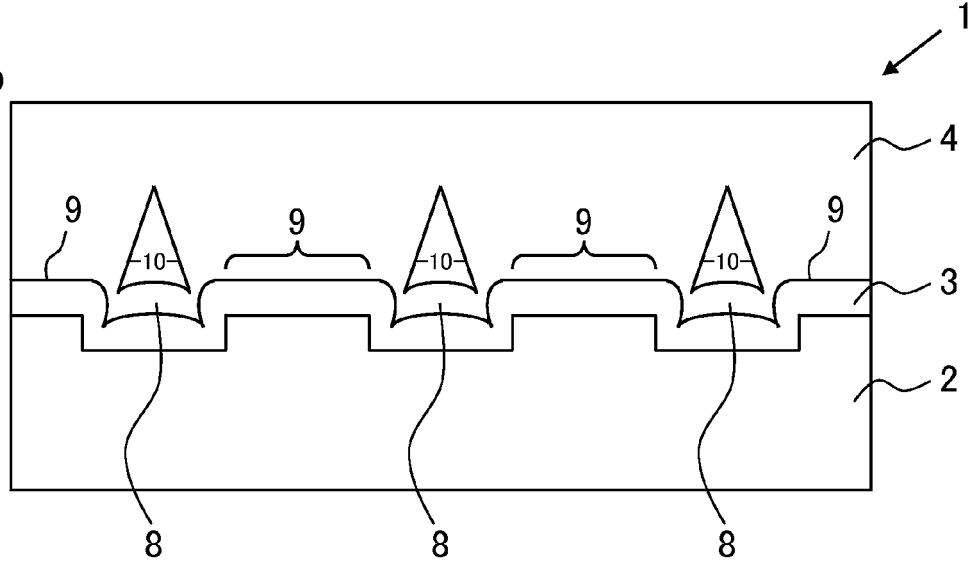
Figure 2A:
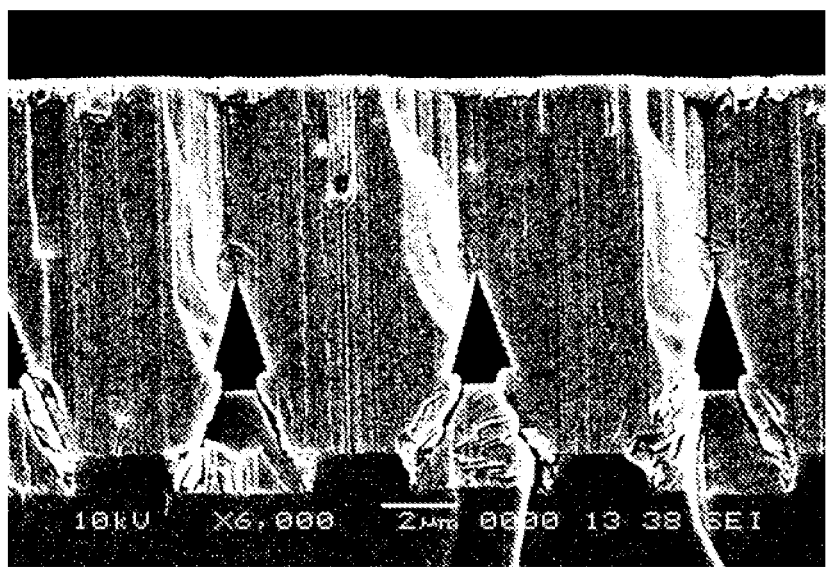
FIGS. 2A and 2B are SEM images (cross-sectional view and bird's-eye view) of a template for epitaxial growth of Example 1 according to the present invention.
Figure 2B:
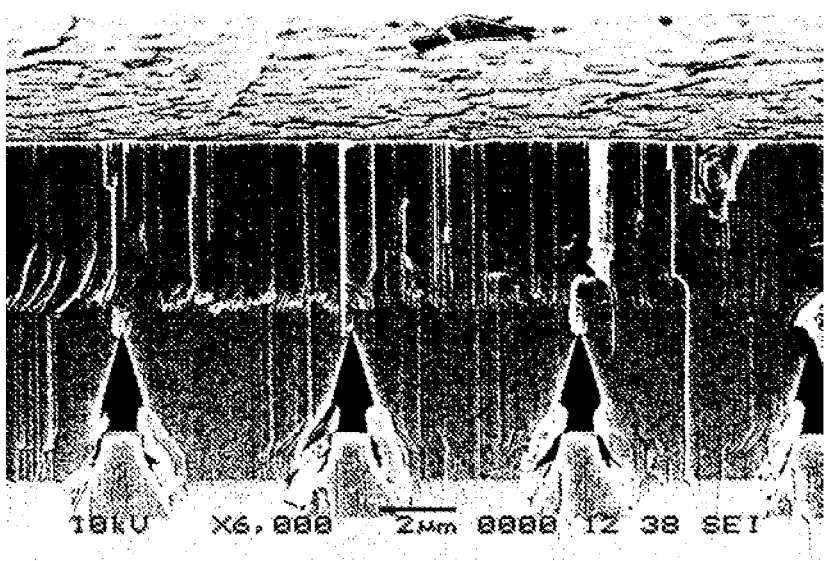
Figure 3A:
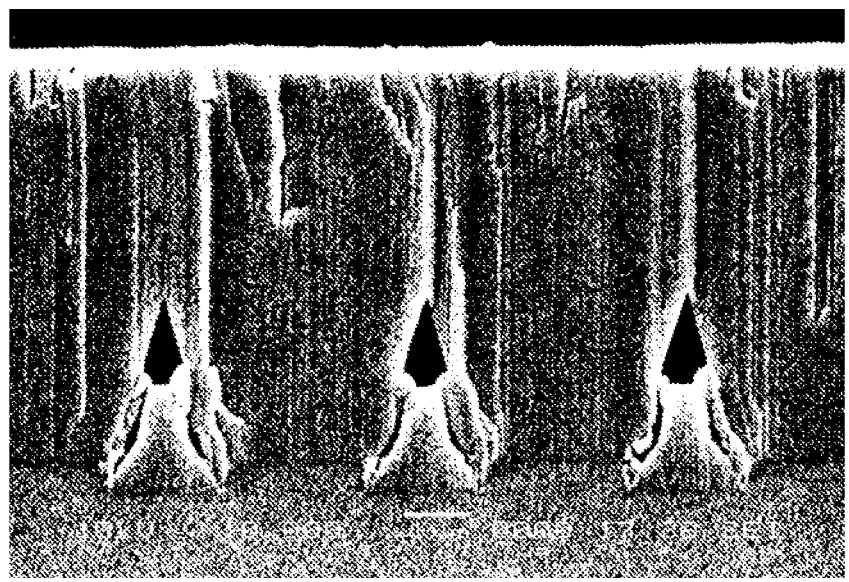
FIGS. 3A and 3B are SEM images (cross-sectional view and bird's-eye view) of a template for epitaxial growth of Example 2 according to the present invention.
Figure 3B:
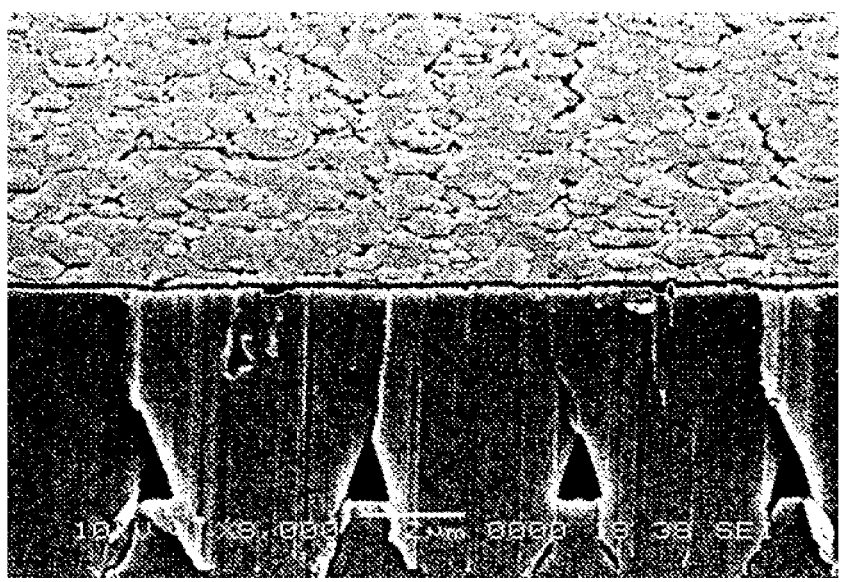

FIGS. 1A to 1D show a cross-sectional flow diagram, schematically illustrating a flow of the present production process. The figures show cross sections during and after the production of the present template. In FIGS. 1A to 1D, essential parts are exaggerated to facilitate understanding of the description, and the proportion of parts in the figures is not necessarily actual. As illustrated in FIG. 1D, the present template 1 includes a sapphire (0001) substrate 2 whose surface is processed so as to have recesses and protrusions, an initial-stage AlN layer 3 that is epitaxially grown on the sapphire (0001) substrate surface having recesses and protrusions, and on the initial-stage AlN layer 3, an $Al_xGa_yN(0001)$ layer 4 ($1 \geq x > 0$, $x+y=1$) that is epitaxially grown by a lateral overgrowth method. The method for producing the present template 1 according to one embodiment will be described in detail with reference to FIGS. 1A to 1D. For the following description, recesses and protrusions on the surface of the substrate 2 are formed with a plurality of grooves 6 extending in the <11-20> direction, and the grooves are recessed inside and intervals between the grooves protrude. Moreover, for the $Al_xGa_yN$ (0001) layer 4 that is epitaxially grown by a lateral overgrowth method, an AlN layer 4 (wherein $x=1$, $y=0$) is used.

First, the sapphire (0001) substrate 2 is prepared, and an Ni mask 5 which is patterned in a stripe shape is formed on the substrate (see FIG. 1A). Then, the substrate surface is etched by a conventional anisotropic etching method such as reactive ion etching (RIE), thereby forming a plurality of grooves 6 extending in the <11-20> direction (see FIG. 1B). A protrusion top 7 between the grooves 6 is a flat (0001) crystal face. In this embodiment, the groove 6 is preferably about 0.3 μm to 1.0 μm in depth, about 1.0 μm to 5.0 μm in width, and about 1.0 μm to 5.0 μm in intervals between the grooves. Moreover, although the plan-view pattern of the grooves is assumed to be stripes in the embodiment, the plan-view pattern of the protrusion tops 7 between the grooves may be in equilateral triangle, regular hexagon, and diamond shapes, in addition to the stripe pattern, as there are three directions that are equivalent to the <11-20> directions.

The sapphire substrate 2 having recesses and protrusions on its surface is put inside a conventional metalorganic vapor phase epitaxy (MOVPE) reaction chamber (not shown), and the initial-stage AlN layer 3 is epitaxially grown on the sapphire substrate 2 by the MOVPE method (see FIG. 1C). The initial-stage AlN layer 3 has a thickness of about 0.2 μm to 1.5 μm. As long as new recesses 8 are formed along the grooves 6 formed on the substrate 2 even after the deposition of the initial-stage AlN layer 3, the initial-stage AlN layer 3 may be thinner or thicker than the depth of the grooves 6. The initial-stage AlN layer 3 is uniformly oriented in the C+ axis at the surface of a growth film as the growth progresses. Once the layer is oriented in the C+ axis, uniform C+ axis orientation will be maintained afterwards, so that there is no need to let the initial-stage AlN layer 3 grow further.

The growth temperature of the initial-stage AlN layer 3 is below 1,300° C., and is set higher (for example, at 1,250° C.) than the epitaxial growth temperature of a general AlGaN layer (1,100° C. to 1,200° C., the crystallization temperature or higher). The pressure is set about 50 Torr or less (for example, about 25 Torr). In the embodiment, the initial-stage AlN layer 3 is subjected to the C axis orientation control (polarity control) so as to orient the growth film from the protrusion tops 7 of the sapphire substrate 2 into the C+ axis; in other words, to provide an Al polar face at the surfaces (protrusion surfaces 9) of the growth film. The C axis orientation control mentioned above is carried out by adjusting the flow ratio ($NH_3/TMA$) between TMA (trimethylaluminum) and $NH_3$ (ammonia) as the materials (precursors) of Al and N under the above-noted temperature and pressure conditions. In this embodiment, as for the conditions of the C axis orientation control, as described above, the pressure is set relatively low (at about below 50 Torr) so as to grow an AlN layer for a template; the growth speed of the layer is set lower than the speed of the AlN layer 4 that is epitaxially grown by a lateral overgrowth method on the initial-stage AlN layer 3; and the flow ratio is, for example, 148.

As for the initial-stage AlN layer 3, it is sufficient that the surfaces (protrusion surfaces 9) of the growth film grown from the protrusion tops 7 are Al polar faces. It is unnecessary to orient the growth film grown from the bottom of the recesses in the grooves 6, into the C+ axis. Moreover, the AlN layer grown from the side walls of the recesses in the grooves 6 is not oriented in the C+ axis, and semi-polar faces or non-polar faces are grown there. Thus, since the edges of the protrusion surfaces 9 have the growth film grown from the side walls of the recesses in the grooves 6, the edges have no Al polar face. The reason only the protrusion surfaces 9 (except for the edges) need to be Al polar faces is because the AlN layer 4, which is epitaxially grown on the initial-stage AlN layer 3 by a lateral overgrowth method, laterally grows from the protrusion surfaces 9 and finally seals the recesses 8, so that the film grown from the recesses 8 stops growing, and consequently it is necessary to consider with respect only to the growth film grown from the protrusion surfaces 9.

Subsequently, an AlN layer 4 is grown by a conventional epitaxial lateral overgrowth method on the initial-stage AlN layer 3 having, on the surface, a recessed and protruded structure (the recesses 8 and the protrusion surfaces 9) formed along the grooves 6 on the sapphire substrate 2 (see FIG. 1D). Like the initial-stage AlN layer 3, the AlN layer 4 is epitaxially grown by the MOVPE method. As with the initial-stage AlN layer 3, the growth temperature of the AlN layer 4 is below 1,300° C., and is set higher (for example, at 1,250° C.) than the epitaxial growth temperature of a common AlGaN layer (1,100° C. to 1,200° C., the crystallization temperature or higher). As one example, growth temperature and pressure conditions are set at the same levels as those for the initial-stage AlN layer 3, and the initial-stage AlN layer 3 and the AlN layer 4 may be sequentially grown in the same reaction chamber. Under the temperature and pressure conditions mentioned above, the flow ratio between TMA and $NH_3$ ($NH_3$/TMA) is adjusted herein so as to induce a lateral overgrowth sufficient to allow the growth films laterally overgrown from both sides of the recesses 8 to join over the recesses 8 and then close the openings thereof, within a given range of growth film thickness in the C-axis direction (for example, about 3 μm to 10 μm). As long as the temperature and pressure conditions are the same as those during the process of growing the initial-stage AlN layer 3, typically, the flow ratio ($NH_3$/TMA) is set smaller than that during the process of growing the initial-stage AlN layer 3. Since the AlN layer 4 keeps growing even after the recesses 8 are sealed with the AlN layer 4 in the embodiment, the growth condition (flow ratio between TMA and $NH_3$) may be changed before and after the recesses 8 are sealed. As shown in FIG. 1D, wedge-shaped cavities (voids) 10 are formed at the portions where the recesses 8 are sealed with the AlN layer 4.

Recesses and protrusions are formed on the sapphire substrate 2, and the initial-stage AlN layer 3 and the AlN layer 4 are sequentially grown as described above, thus providing a template for epitaxial growth having a fine and flat surface and a reduced threading dislocation density (the present template 1).

The following describes examples (Examples 1 to 8) of the present template 1 produced by the present production method, and comparative examples (Comparative Examples 1 to 3) of templates not produced by the present production method with reference to the drawings. In the SEM images shown in the description below, a direction perpendicular to the image (cross section) is the extending direction of the grooves 6 that is the <11-20> direction; and a direction parallel to the image (cross section) and the surface of the sapphire substrate 2 is the <1-100> direction of the sapphire substrate 2. In the examples and comparative examples below, the growth temperatures of the initial-stage AlN layer 3 and the AlN layer 4 are both 1,250° C., and the growth conditions of the AlN layer 4 are the same. The growth conditions of the initial-stage AlN layer 3 are the same in the examples below. For the description below, the same reference numerals as in Examples 1 to 8 are used for the initial-stage AlN layer (in Comparative Examples 1 and 2) and the AlN layer that is epitaxially grown by a lateral overgrowth method in Comparative Examples 1 to 3, making clear that each one of the initial-stage AlN layer 3 and the AlN layer 4 corresponds to each other. The gradation of the SEM and TEM images shown below is binarized for international application, so that the images are less clear than actual photographic images.

Example 1 and Example 2

FIGS. 2A and 2B and FIGS. 3A and 3B show the SEM images (cross-sectional views 2A and 3A and bird's-eye views 2B and 3B) of Examples 1 and 2. In Example 1, the width of the grooves 6 on the surface of the sapphire substrate 2 and the gaps between the grooves 6 are 3 μm respectively, and the depth thereof is 1 μm. The thicknesses of the initial-stage AlN layer 3 and the AlN layer 4 are 1.0 μm and 9.8 μm respectively. In Example 2, the width of the grooves 6 on the surface of the sapphire substrate 2 and the gaps between the grooves 6 are 2 μm respectively, and the depth thereof is 0.5 μm. The thicknesses of the initial-stage AlN layer 3 and the AlN layer 4 are 1.0 μm and 6.2 μm respectively.

FIGS. 2A and 2B and FIGS. 3A and 3B show that the AlN layers 4 have a fine and flat surface because the layers were formed on the C+ axis oriented ininitial-stage AlN layers 3, although there is a difference in size of recesses and protrusions on the surface of the sapphire substrate 2.

Comparative Example 1 and Example 2

Figure 4A:
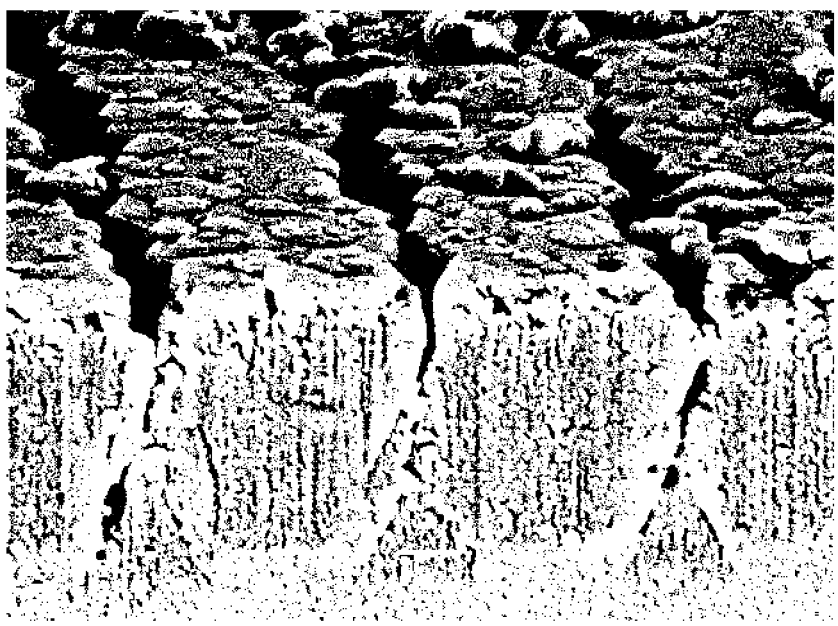
FIGS. 4A and 4B are SEM images (bird's-eye views) of a template for epitaxial growth of Comparative Example 1, each showing a state in which an AlN layer is formed by a lateral overgrowth method and a state in which the layer is etched with KOH alkaline solution.
Figure 4B:
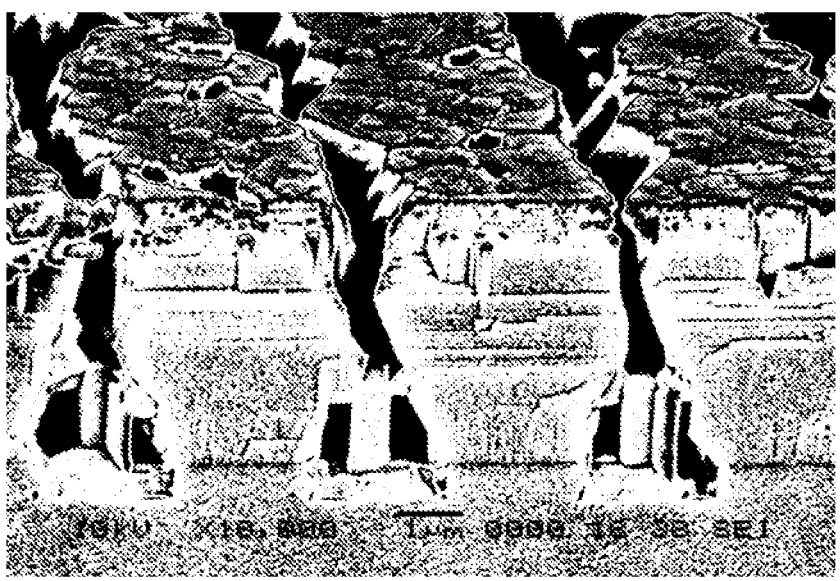
Figure 5:
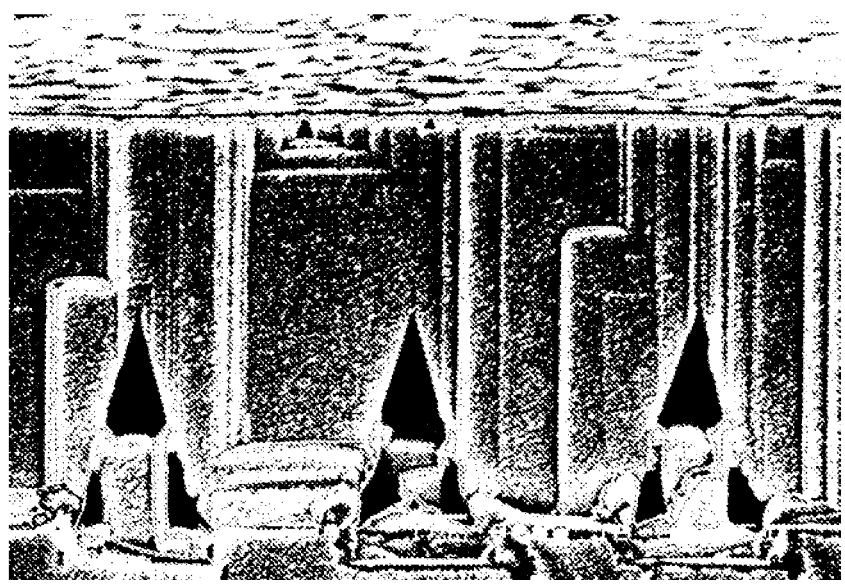
FIG. 5 is an SEM image (bird's-eye view), showing a state in which Example 2 shown in FIG. 3 is etched with KOH alkaline solution.

FIGS. 4A and 4B and FIG. 5 show the SEM images of Comparative Example 1 and Example 2. FIG. 4A shows a bird's-eye view of a state in which the AlN layer 4 of Comparative Example 1 was formed; and FIG. 4B shows a bird's-eye view of a state in which the layer was etched with KOH alkaline solution. FIG. 5 is a bird's-eye view showing a state in which Example 2 shown in FIGS. 3A and 3B was etched with KOH alkaline solution.

In Comparative Example 1, a C-axis oriented initial-stage AlN layers 3 instead of the C+ axis oriented initial-stage AlN layers 3, was formed, and the AlN layer 4 was epitaxially grown by a lateral overgrowth method under the same growth conditions as in Examples 1 and 2. Specifically, Comparative Example 1 has the polarity of the C axis orientation control for the initial-stage AlN layer 3 that is different from the polarity in Examples 1 and 2. In Comparative Example 1, the width of the grooves 6 on the surface of the sapphire substrate 2 and the gaps between the grooves 6 are 2 μm respectively, and the depth thereof is 0.5 μm. The thicknesses of the initial-stage AlN layer 3 and the AlN layer 4 are 0.5 μm and 4 μm respectively. Additionally, the growth conditions of the C-axis oriented initial-stage AlN layers 3 in Comparative Example 1 are the same as the growth temperature and the pressure in Examples 1 and 2, but the flow ratio between TMA and NH$_3$ (NH$_3$/TMA) is different from the rate in Examples 1 and 2. While the flow ratio between TMA and NH$_3$ (NH$_3$/TMA) is 148 in Examples 1 and 2, the ratio in Comparative Example 1 is relatively high at 1,154.

When FIG. 4A of Comparative Example 1 is compared with FIGS. 2 and 3 of Examples 1 and 2, there is a clear difference in the roughness of crystal surfaces after the AlN layer 4 was formed, and the surface of the AlN layer 4 in Examples 1 and 2 is finer and flatter than the surface in Comparative Example 1. Furthermore, the etching speeds of a C+ axis oriented Al polar face and a C- axis oriented N polar face are different from each other with respect to KOH alkaline solution. Since it is easier to etch the N polar face, the orientation of the formed AlN layer 4 is visible by an etching treatment with KOH alkaline solution. When Comparative Example 1 and Example 2 after the etching treatment shown in FIG. 4B and FIG. 5 are compared, it is realized that the AlN layer 4 of Example 2 is also uniformly oriented in the C+ axis because it is formed on the C+ oriented initial-stage AlN layer 3. On the contrary, in Comparative Example 1, the initial-stage AlN layer 3 is not controlled to be oriented in the C+ axis, so that the polarities of C axis orientation of the AlN layer 4 formed on the layer 3 are mixed; in other words, the layer is grown with the mixture of Al polar faces and N polar faces. The comparative results between Examples 1 and 2 and Comparative Example 1 clearly show that an AlN layer 4 having a fine and flat surface is obtained by providing the C+ axis oriented initial-stage AlN layer 3.

Example 3 and Comparative Example 2

Figure 6A:
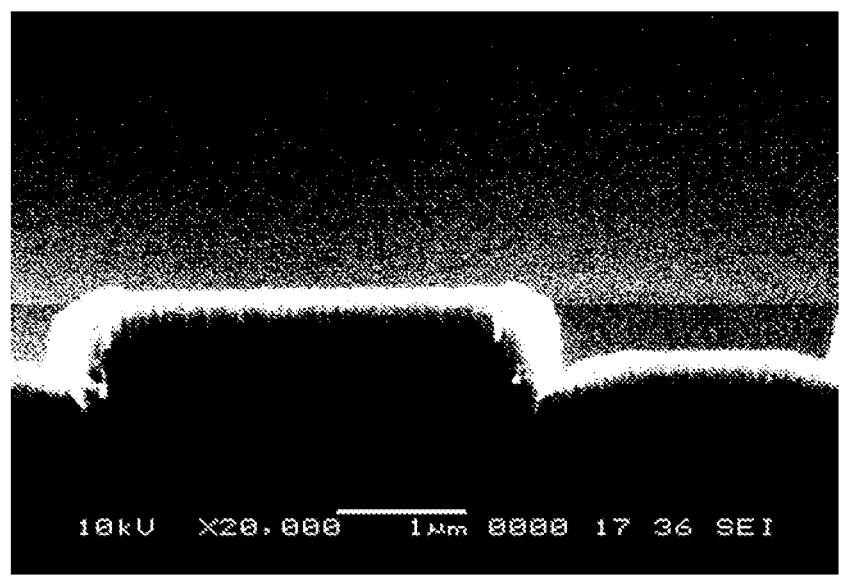
FIGS. 6A and 6B are SEM images (cross-sectional view and bird's-eye view) of a template for epitaxial growth of Example 3 according to the present invention, each showing a state in which an initial-stage AlN layer is formed.
Figure 6B:
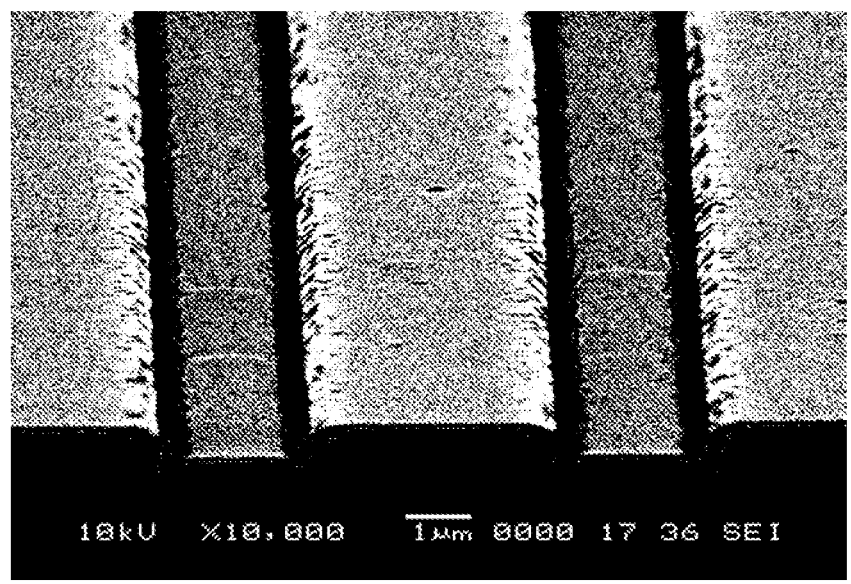
Figure 7A:
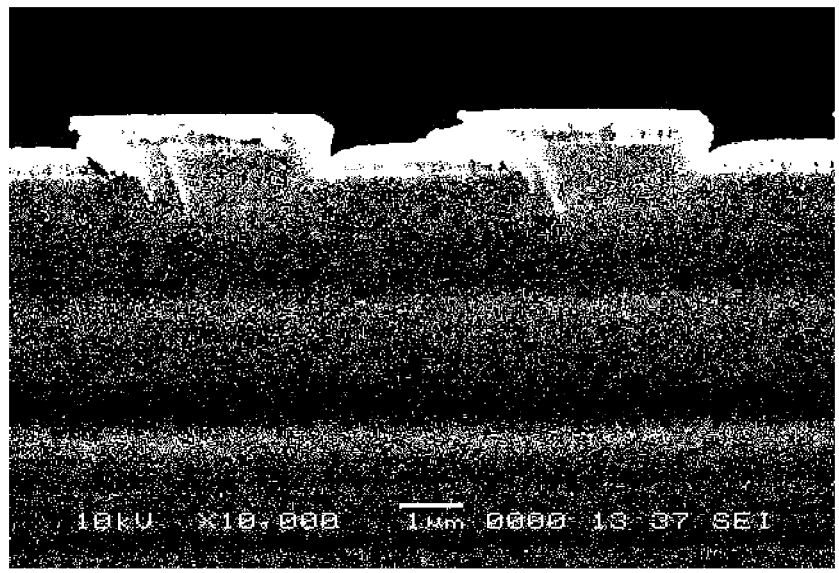
FIGS. 7A and 7B are SEM images (cross-sectional view and bird's-eye view) of a template for epitaxial growth of Comparative Example 2, each showing the state in which an initial-stage AlN layer is formed.
Figure 7B:
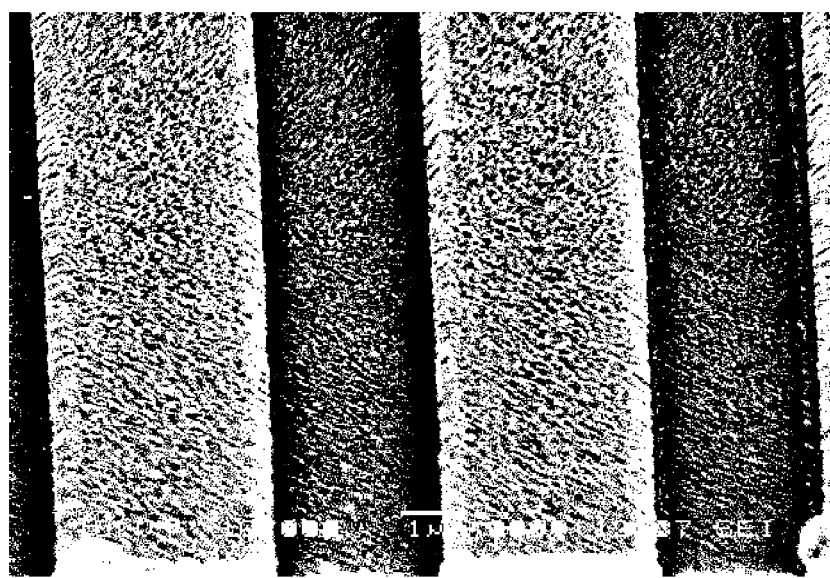

FIGS. 6A and 6B and FIGS. 7A and 7B show the SEM images of Example 3 and Comparative Example 2. FIG. 6A is a cross-sectional view and FIG. 6B is a bird's-eye view after the initial-stage AlN layer 3 of Example 3 was formed, and FIG. 7A is a cross-sectional view and FIG. 7B is a bird's-eye view after the initial-stage AlN layer 3 of Comparative Example 2 was formed. The initial-stage AlN layer 3 of Comparative Example 2 was formed under the same conditions as the C-axis oriented initial-stage AlN layer 3 of Comparative Example 1. In Example 3 and Comparative Example 2, the width of the grooves 6 on the surface of the sapphire substrate 2 and the gaps between the grooves 6 are 3 μm respectively, and the depth thereof is 0.5 μm. The initial-stage AlN layer 3 has a thickness of 0.7 μm in Example 3, and the C-axis oriented initial-stage AlN layer 3 has a thickness of 0.5 μm in Comparative Example 2.

When FIG. 6 and FIG. 7 are compared, it is realized that, after the initial-stage AlN layer 3 was formed, there is already a difference in surface roughness at the surface (protrusion surfaces 9) of the film grown from the protrusion tops 7 and that the protrusion surfaces 9 are finer in Example 3 than in Comparative Example 2. Accordingly, it is found that there is a clear difference in crystal surface roughness after the AlN layer 4 was formed as shown in the comparative results between Examples 1, 2 and Comparative Example 1. The comparative results between Examples 1 to 3 and Comparative Examples 1 and 2 clearly show that an AlN layer 4 having a fine and flat surface is obtained by orienting the initial-stage AlN layer 3 in the C+ axis.

Comparative Example 3

Figure 8A:
FIGS. 8A and 8B are SEM images (cross-sectional view and bird's-eye view) of a template for epitaxial growth of Comparative Example 3, each showing the state in which an AlN layer is formed by a lateral overgrowth method.
Figure 8B:

FIGS. 8A and 8B are SEM images of Comparative Example 3. FIG. 8A is a cross-sectional view and FIG. 8B is a bird's-eye view after the AlN layer 4 of Comparative Example 3 was formed.

In Comparative Example 3, without forming the C+ oriented initial-stage AlN layer 3, an AlN layer 4 was directly epitaxially grown on the sapphire substrate 2 having the grooves 6 on its surface by a lateral overgrowth method under the same conditions as in Examples 1 and 2. Specifically, Comparative Example 3 is different from Examples 1 and 2 in respect to whether or not the initial-stage AlN layer 3 was formed. In Comparative Example 3, the width of the grooves 6 on the surface of the sapphire substrate 2 and the gaps between the grooves 6 are 3 μm respectively, and the depth thereof is 0.5 μm. The thickness of the AlN layer 4 is 10 μm.

As shown in FIGS. 8A and 8B, the surface of the AlN layer 4 in Comparative Example 3 is not as fine and flat as the surface of the AlN layer 4 formed on the C+ axis oriented initial-stage AlN layer 3. Moreover, similarly to the Comparative Example 3, also in other comparative examples where the AlN layer 4 was directly epitaxially grown by a lateral overgrowth method on the sapphire substrate 2 having the grooves 6 on the surface without forming the C+ axis oriented initial-stage AlN layer 3 under the same growth temperature and pressure conditions as in Examples 1 and 2, but with different flow rates between TMA and NH$_3$ (NH$_3$/TMA), although SEM images are not shown herein, it is found that the surface of the AlN layer 4 is not as fine and flat as that formed on the C+ axis oriented initial-stage AlN layer 3. Accordingly, it is understood that the AlN layer 4 cannot be easily epitaxially grown directly on the sapphire substrate 2 formed with the grooves 6 on its surface by a lateral overgrowth method at the growth temperature of 1,250° C.

When FIGS. 8A and 8B of Comparative Example 3 and FIGS. 2A and 2B and FIGS. 3A and 3B of Examples 1 and 2 are compared, after the AlN layer 4 was formed, it is found that there is a clear difference in crystal surface roughness, and the surface of the AlN layer 4 is finer and flatter in Examples 1 and 2 than in Comparative Example 3. According to the comparative results of Examples 1, 2 and Comparative Examples 1 to 3, as compared with either the case where the C-axis oriented initial-stage AlN layer 3 is provided or the case where the C+ axis oriented initial-stage AlN layer 3 is not provided, it is clearly shown that an AlN layer 4 having a finer and flatter surface is obtained at the growth temperature of 1,250° C.; in other words, below 1,300° C., by providing the C+ axis oriented initial-stage AlN layer 3.

Example 4

Figure 9A:
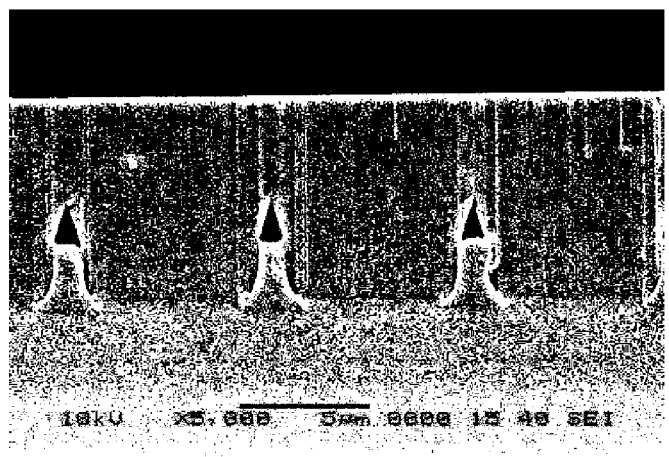
FIGS. 9A and 9B are SEM images (cross-sectional view and bird's-eye view) of a template for epitaxial growth of Example 4 according to the present invention.
Figure 9B:
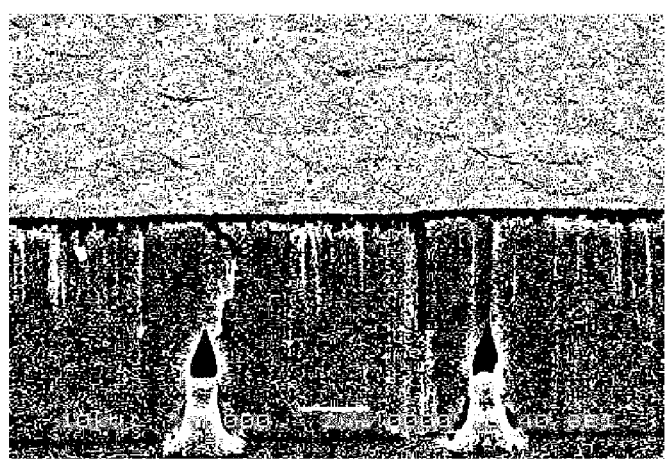

FIGS. 9A and 9B show the SEM images of Example 4. FIG. 9A is a cross-sectional view and FIG. 9B is a bird's-eye view after the AlN layer 4 of Example 4 was formed and then an Al$_{0.8}$Ga$_{0.2}$N layer was sequentially grown thereon by the MOVPE method. The growth temperature of the Al$_{0.8}$Ga$_{0.2}$N layer is 1,160° C., and the flow ratio (NH$_3$/MO) of TMA, TMG (trimethylgallium) and NH$_3$ is 899. In Example 5, the width of the grooves 6 formed on the surface of the sapphire substrate 2 is 5 μm; the gaps between the grooves 6 are 5 μm; and the depth thereof is 0.3 μm. The thicknesses of the initial-stage AlN layer 3, the AlN layer 4, and the Al$_{0.8}$Ga$_{0.2}$N layer are 1.3 μm, 5.8 μm and 1.8 μm, respectively.

FIGS. 9A and 9B clearly show that the Al$_{0.8}$Ga$_{0.2}$N layer formed on the AlN layer 4 also has a fine and flat surface like the AlN layer 4 by orienting the initial-stage AlN layer 3 in the C+ axis, and that the AlGaN layer of high crystal quality is formed on the present template 1. The surface of the Al$_{0.8}$Ga$_{0.2}$N layer of Example 4 was analyzed by the x-ray rocking curve (XRC) method: the average full widths at half maximum FWHM (arcsec) were 293 (ω mode: tilt distribution) and 625 (φmode: twist distribution), showing preferable results.

Example 5

Figure 10:
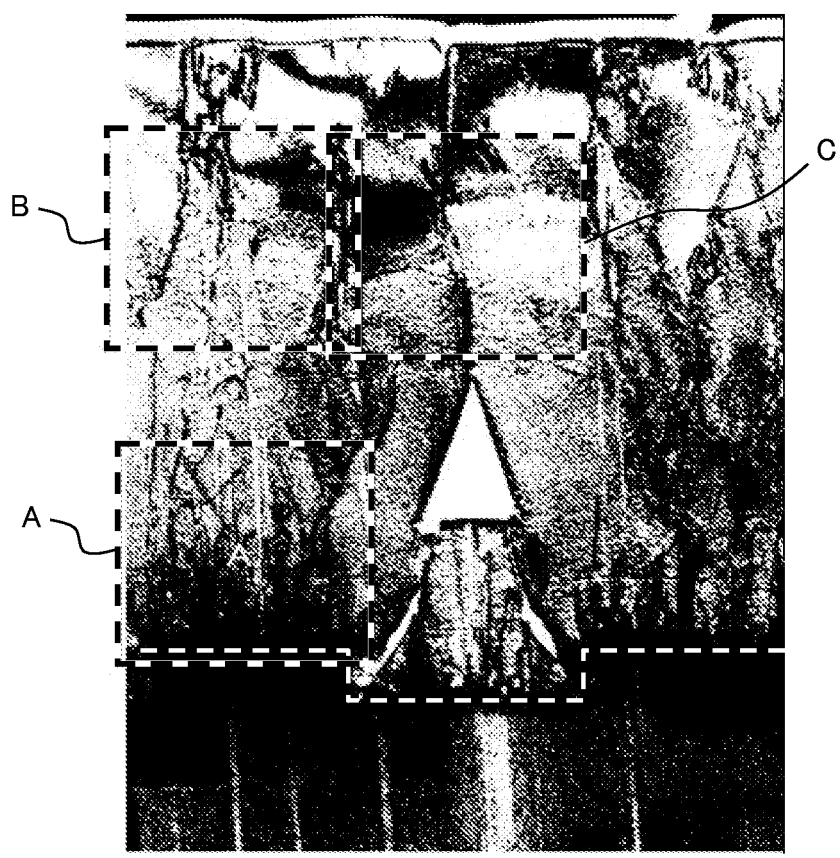
FIG. 10 is a cross-sectional TEM image of a template for epitaxial growth of Example 5 according to the present invention.

FIG. 10 shows a cross-sectional TEM image (bright field image) after the AlN layer 4 of Example 5 was formed. In Example 5, the width of the grooves 6 on the surface of the sapphire substrate 2 and the gaps between the grooves 6 are 2 μm respectively, and the depth thereof is 0.5 μm. The thicknesses of the initial-stage AlN layer 3 and the AlN layer 4 are 1.0 μm and 6.5 μm, respectively.

Figure 11A:
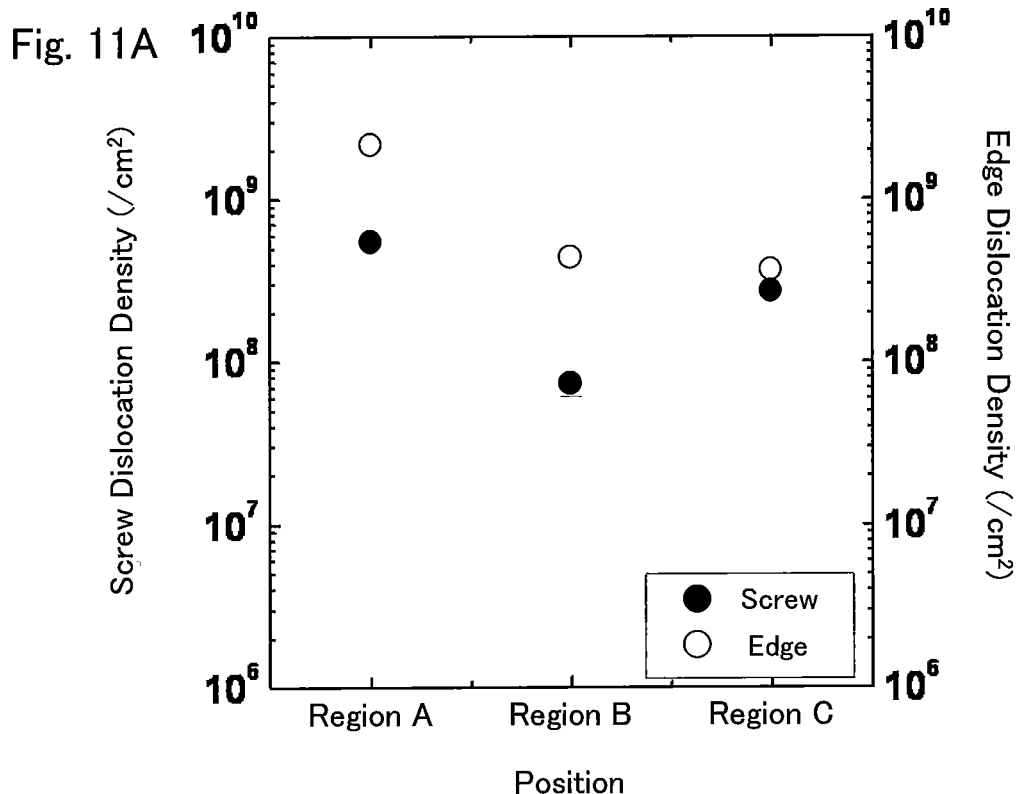
FIGS. 11A and 11B show evaluation results of dislocation density of the template for epitaxial growth of Example 5 according to the present invention.
Figure 11B:
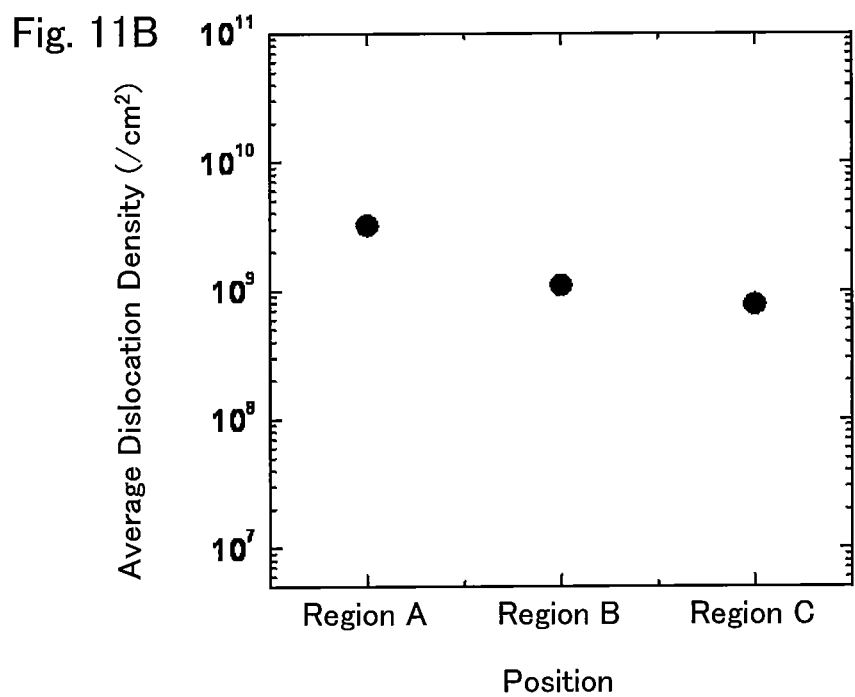

FIGS. 11A and 11B show the results in which the threading dislocation density of Example 5 was evaluated, by using the cross-sectional TEM image shown in FIG. 10. In FIG. 11A, open circles ○ indicate edge dislocation densities at three regions A to C and filled circles ● indicate screw dislocation densities at three regions A to C. FIG. 11B shows average threading dislocation densities at three regions A to C. Regarding the three regions A to C, the region A indicates the region of the initial-stage AlN layer 3 above the protrusion surfaces 9 and the initial-stage growth layer of the AlN layer 4 (the upper and lower positions are below the center of the voids 10); the region B indicates the region of the later-stage growth layer of the AlN layer 4 above the protrusion surfaces 9 (the upper and lower positions are above the tips of the voids 10); and the region C indicates the region of the later-stage growth layer of the AlN layer 4 above the recesses 8 (the upper and lower positions are above the tips of the voids 10). FIGS. 11A and 11B show that reduced threading dislocation densities are achieved at the regions B and C in comparison with the region A. A preferable value of about $10^7/cm^2$ was obtained when the dislocation density was assumed from the analysis of x-ray diffractometry (XRD) method.

Example 6 to 8

Figure 12:
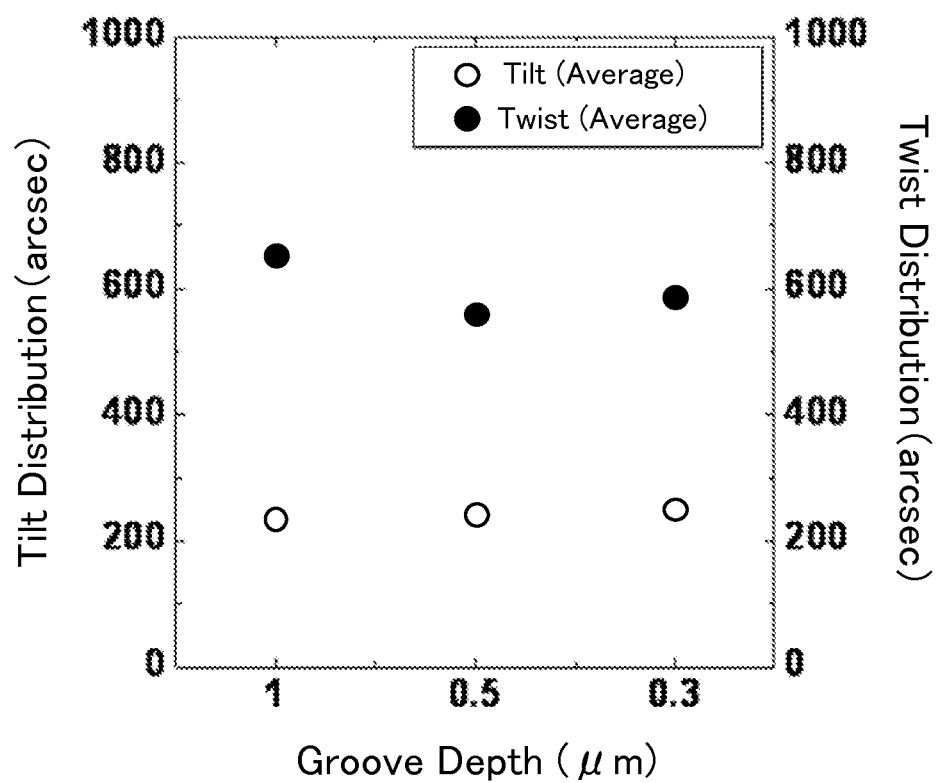
FIG. 12 shows a surface analysis result of the templates for epitaxial growth of Examples 6 to 8 according to the present invention.
Figure 13:
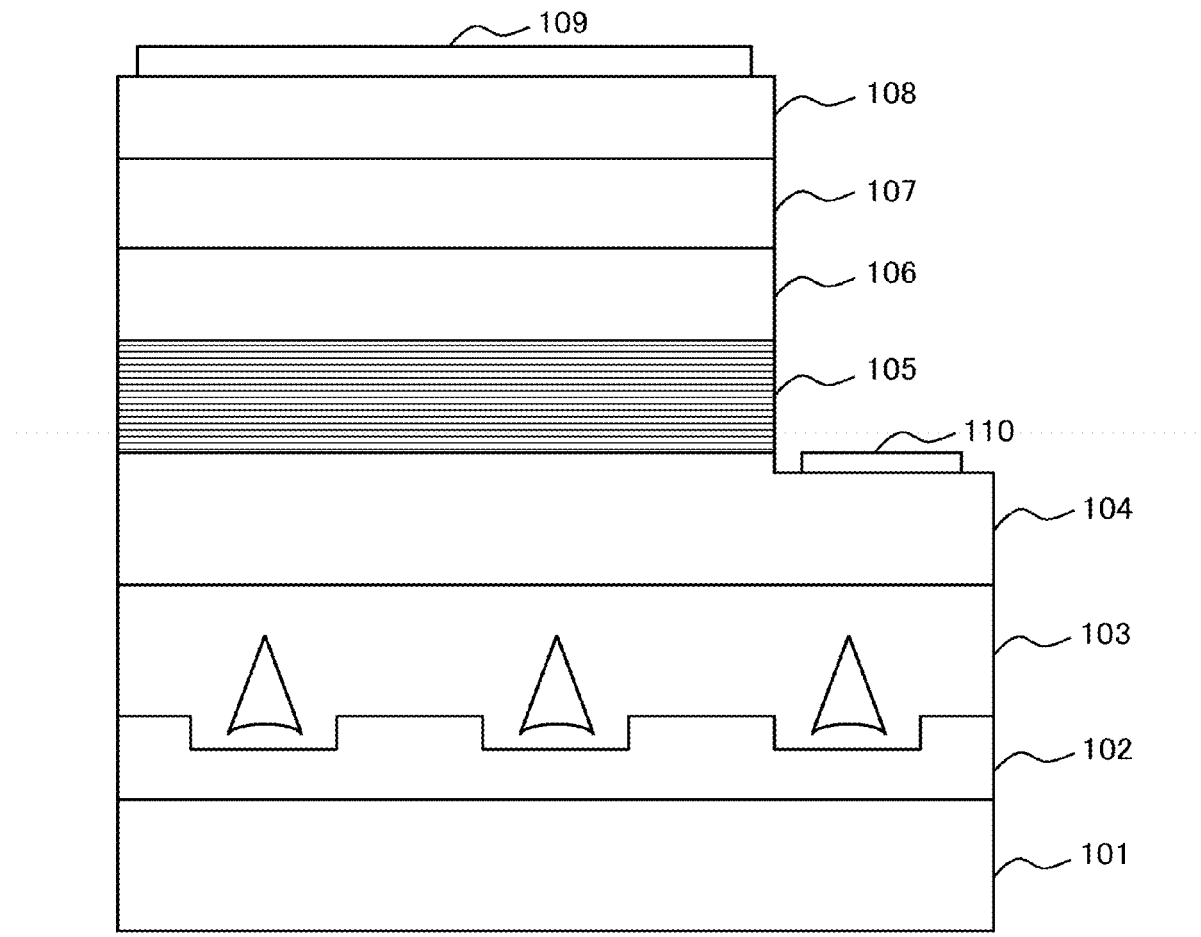
FIG. 13 is a cross-sectional view, schematically illustrating the typical crystal layer structure of a conventional GaN light-emitting diode.

FIG. 12 shows the surface analysis of the AlN layers 4 of Examples 6 to 8 by the XRC method. In Examples 6 to 8, the width of the grooves 6 on the surface of the sapphire substrate 2 is 3 μm and the gaps between the grooves 6 are 5 μm respectively, and the depths thereof are 1 μm, 0.5 μm, and 0.3 μm. The thicknesses of the initial-stage AlN layer 3 and the AlN layer 4 are 1.3 μm and 5 μm respectively within the error range of about ±0.3 μm. In Examples 6 to 8, the rest of the conditions are all the same, except that the depths of the grooves 6 are different from each other. FIG. 12 shows each full width at half maximum FWHM (arcsec) of Examples 6 to 8. In FIG. 12, open circles ○ indicate the average full widths at half maximum of tilt distribution, and filled circles ● indicate the average full widths at half maximum of twist distribution, respectively.

It is generally considered preferable to form deeper grooves on the surface of a sapphire substrate when an AlN layer or the like is directly epitaxially grown on a sapphire substrate having recesses and protrusions thereon by a lateral overgrowth method (see for example, Non-patent Document 3 above). Specifically, when the grooves are shallow, a layer grown from the protrusions between the grooves and a layer grown from the inside of the grooves cannot be separated effectively, so that the effects from the lateral overgrowth cannot be obtained. However, it is confirmed that in the present production method, preferable results are obtained even when the grooves on the sapphire substrate surface are relatively shallow at 0.3 μm to 1 μm. Although the dependency on groove depths is unclear in the analysis result of XRC method, it is preferable that the groove depth is shallow at about 0.3 μm to 0.5 μm according to the pit observation of the surface. When the groove depth is about below 0.5 μm in the present production method, the sapphire substrate 2 receives less damage from the etching process of forming grooves, so that an initial-stage AlN layer 3 of a higher quality is provided and also the costs of forming grooves may be cut, which is thus more preferable.

It is clearly seen, based on the description of the present template 1 of the examples (Examples 1 to 8) and of the comparative examples (Comparative Examples 1 and 2) which were produced without depending on the present production method, that an AlN layer 4 having a fine and flat surface and a reduced threading dislocation density is obtained by subjecting an initial-stage AlN layer 3 to C+ axis orientation. It is also found that a GaN nitride semiconductor layer of high crystal quality is obtained by forming a GaN nitride semiconductor layer (AlGaNIn layer) that is included in a GaN nitride semiconductor device such as a light-emitting diode and a semiconductor laser, on the AlN layer 4 of the present template 1. Accordingly, a GaN nitride semiconductor device of higher properties is provided by using the present template 1.

The present production method and present template were described above in detail. However, the characteristic of the present invention lies in the provision of a C+ axis oriented initial-stage AlN layer 3. The above-noted process and conditions are simply an example for description, and these conditions and the like may be appropriately modified without departing from the present invention including the above characteristic.

For description, although the AlN layer 4 is epitaxially grown on the initial-stage AlN layer 3 by a lateral overgrowth method in the above-noted embodiments, an AlGaN layer, instead of an AlN layer, may be used as a semiconductor layer that is epitaxially grown on the initial-stage AlN layer 3 by a lateral overgrowth method. In the embodiments, although not discussed in the examples, it is conventionally known that it is easier to laterally overgrow an AlGaN layer than an AlN layer since Ga can be easily dissolved and that, as disclosed in e.g., Patent Document 1, an AlGaN layer or a GaN layer, instead of an AlN layer, is directly epitaxially grown by a lateral overgrowth method on a sapphire substrate having recesses and protrusions on its surface, so that it is obvious that the present invention is also applicable to the lateral overgrowth of an AlGaN layer.

In the embodiments mentioned above, as the C axis orientation control method by which it is possible to obtain the C+ axis oriented initial-stage AlN layer 3, which is the characteristic of the present invention, it has been described that flow ratios ($NH_3$/TMA) were adjusted so as to orient the layer to C axis; however the C axis orientation control method may be accomplished by controlling with reaction gas, supplying TMA earlier at the initial-growth stage or the like, instead of adjusting the flow ratios. Moreover, for the above-noted description, the metalorganic vapor phase epitaxy (MOVPE) is applied as the method of growing the initial-stage AlN layer 3 and the AlN layer 4, but the hydride VPE (vapor phase epitaxy) method may be applied as the growth method instead of MOVPE. Furthermore, in the embodiments, although the surface of the sapphire (0001) substrate 2 is processed to form recesses and protrusions by photolithography and anisotropic etching, as the recesses and protrusions forming process, processing methods other than anisotropic etching may be applied as long as flat protrusion tops are provided.

INDUSTRIAL APPLICABILITY

The template for epitaxial growth and the method for producing the same according to the present invention are applicable to produce a GaN nitride semiconductor device such as a light-emitting diode and a semiconductor laser.

EXPLANATION OF REFERENCES

1: Template for epitaxial growth according to the present invention
2: Sapphire (0001) substrate
3: Initial-stage AlN layer
4: $Al_xGa_yN(0001)$ layer
5: Ni mask
6: Grooves formed on the surface of the sapphire substrate
7: Protrusion top
8: Recess of initial-stage AlN layer
9: Protrusion surface of initial-stage AlN layer
10: Cavity (void)

The invention claimed is:

1. A method for producing a template for epitaxial growth, comprising:
    processing a surface of a sapphire (0001) substrate to form recesses and protrusions on the surface so that protrusion tops are made flat with a given plan-view pattern;
    epitaxially growing an initial-stage AlN layer at a growth temperature higher than a crystallization temperature of AlN on the surface of the sapphire (0001) substrate having the recesses and protrusions by performing C axis orientation control so that a C+ axis oriented AlN layer grows on flat surfaces of the protrusion tops, excluding edges, and that the AlN layer deposited on the recesses obtained by the recesses and protrusions forming process forms new recesses over the recesses; and
    epitaxially growing an $Al_xGa_yN(0001)$ layer ($1 \geq x > 0$, $x+y=1$) on the initial-stage AlN layer by a lateral overgrowth method so as to cover the new recesses with the $Al_xGa_yN(0001)$ layer laterally overgrown from above the protrusion tops, wherein:
    a growth method for epitaxially growing the initial-stage AlN layer by performing C axis orientation control is different from the lateral overgrowth method for epitaxially growing the $Al_xGa_yN$ (0001) layer, and
    the initial-stage AlN layer is grown and deposited on the flat surfaces of the protrusion tops and on side walls and bottom surfaces of the recesses obtained by the recesses and protrusions forming process.

2. The method for producing a template for epitaxial growth according to claim 1, wherein the recesses are formed on the surface of the sapphire (0001) substrate at a depth of 1.0 µm or less.

3. The method for producing a template for epitaxial growth according to claim 1, wherein an AlN layer that is not oriented in C+ axis is grown near steps formed by the recesses and protrusions during growth of the initial-stage AlN layer.

4. The method for producing a template for epitaxial growth according to claim 2, wherein an AlN layer that is not oriented in C+ axis is grown near steps formed by the recesses and protrusions during growth of the initial-stage AlN layer.

5. The method for producing a template for epitaxial growth according to claim 1, wherein the $Al_xGa_yN(0001)$ layer is an AlN(0001) layer.

6. The method for producing a template for epitaxial growth according to claim 2, wherein the $Al_xGa_yN(0001)$ layer is an AlN(0001) layer.

7. The method for producing a template for epitaxial growth according to claim 1, wherein a growth condition for epitaxially growing the initial-stage AlN layer by performing C axis orientation control is different from that for epitaxially growing the $Al_xGa_yN$ (0001) layer by the lateral overgrowth method.

8. The method for producing a template for epitaxial growth according to claim 1, wherein a growth speed for epitaxially growing the initial-stage AlN layer by performing C axis orientation control is lower than that for epitaxially growing the $Al_xGa_yN$ (0001) layer by the lateral overgrowth method.

* * * * *